(12) United States Patent
Masai et al.

(10) Patent No.: US 9,780,294 B2
(45) Date of Patent: *Oct. 3, 2017

(54) PIEZOELECTRIC COMPOSITION AND PIEZOELECTRIC ELEMENT

(71) Applicant: TDK CORPORATION, Tokyo (JP)

(72) Inventors: Taku Masai, Tokyo (JP); Keisuke Teranishi, Tokyo (JP); Masahito Furukawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 227 days.

This patent is subject to a terminal disclaimer.

(21) Appl. No.: 14/535,880

(22) Filed: Nov. 7, 2014

(65) Prior Publication Data

US 2015/0129792 A1 May 14, 2015

(30) Foreign Application Priority Data

Nov. 13, 2013 (JP) .................................. 2013-235123
Aug. 29, 2014 (JP) .................................. 2014-175568

(51) Int. Cl.

| H01L 41/18 | (2006.01) |
|---|---|
| H01L 41/187 | (2006.01) |
| C04B 35/475 | (2006.01) |
| H01L 41/08 | (2006.01) |
| H01L 41/083 | (2006.01) |
| H01L 41/273 | (2013.01) |
| H01L 41/316 | (2013.01) |

(52) U.S. Cl.
CPC ........ *H01L 41/1878* (2013.01); *H01L 41/083* (2013.01); *H01L 41/0805* (2013.01); *H01L 41/273* (2013.01); *H01L 41/316* (2013.01)

(58) Field of Classification Search
CPC ............ H01L 41/0805; H01L 41/1878; H01L 41/1873; H01L 41/18; C04B 35/475; C04B 2235/768
USPC ............... 252/62.9 PZ, 62.9 R; 501/134–136
See application file for complete search history.

(56) References Cited

U.S. PATENT DOCUMENTS

| 9,437,807 B2* | 9/2016 | Saya ................... H01L 41/1878 |
|---|---|---|
| 2002/0036282 A1* | 3/2002 | Chiang ................ C01G 23/006 252/62.9 R |
| 2010/0208007 A1* | 8/2010 | Nihei ................... B41J 2/14233 347/68 |

(Continued)

FOREIGN PATENT DOCUMENTS

| CN | 101200370 A | 6/2008 |
|---|---|---|
| CN | 103119743 A | 5/2013 |

(Continued)

*Primary Examiner* — Matthew E Hoban
*Assistant Examiner* — Lynne Edmondson
(74) *Attorney, Agent, or Firm* — Oliff PLC

(57) ABSTRACT

The present invention aims to provide an excellent piezoelectric composition and an excellent piezoelectric element if the piezoelectric properties especially a high spontaneous polarization and a sufficiently high resistivity, the low pollution, the environment and the ecology are considered. In the piezoelectric composition, the main component contains the substance represented by the following formula with a perovskite-typed structure, $(Bi_{(0.5x+y+z)}Na_{0.5x})_m(Ti_{x+0.5y}Mg_{0.5y}Al_z)O_3$. Wherein, $0.01 \leq x \leq 0.8$, $0.2 \leq y \leq 0.8$, $0.01 \leq z \leq 0.6$, $0.75 \leq m \leq 1.0$, and $x+y+z=1$.

2 Claims, 2 Drawing Sheets

(56) References Cited

U.S. PATENT DOCUMENTS

2012/0187325 A1  7/2012  Hoffmann et al.
2013/0153812 A1  6/2013  Jeon et al.

FOREIGN PATENT DOCUMENTS

JP  A-2013-500919  1/2013
WO  2013/026668 A1  2/2013

* cited by examiner

PIEZOELECTRIC COMPOSITION AND PIEZOELECTRIC ELEMENT

The present invention relates to a piezoelectric composition and a piezoelectric element widely used in fields of piezoelectric sound generator, piezoelectric sensor, piezoelectric actuator, piezoelectric transformer or piezoelectric ultrasonic motor or the like.

BACKGROUND

A piezoelectric element with a piezoelectric composition used therein will deform when an electric field is externally applied and can generate electric charges on the surface when it receives an external stress. Recently, such a piezoelectric element is widely used in various fields.

For example, a piezoelectric element which uses a piezoelectric composition such as lead zirconate titanate (Pb(Zr, Ti)$O_3$: PZT) and the like will deform in proportion to the applied electric voltage with a displacement value of about $1 \times 10^{-10}$ m/V. Thus, such a piezoelectric element is excellent in fine position adjustment and can be further used for fine adjustment in an optical system.

Besides, as a piezoelectric composition will generate electric charges in proportion to the applied stress or the deformation caused by the stress, it also can be employed as a sensor for detecting minute forces or the extent of deformations.

Furthermore, a piezoelectric composition has an excellent responsiveness. Thus, when an alternating current field is applied, resonance could occur due to the excitation of the piezoelectric composition itself or an elastic body coupled with the piezoelectric composition. In this respect, a piezoelectric composition can also be used as a piezoelectric transformer, a ultrasonic motor and etc.

Currently, most of the piezoelectric compositions in practical use are solid solutions (PZT-based) composed of PbZrO$_3$(PZ)—PbTiO$_3$(PT). The piezoelectric compositions meeting various requirements can be widely developed by adding various accessory ingredients or additives into the PZT-based piezoelectric composition.

There are different piezoelectric compositions such as a piezoelectric composition with a low mechanical quality factor (Qm) and a high piezoelectric constant (d), and a piezoelectric composition with a low piezoelectric constant (d) and a high mechanical quality factor (Qm). The previous one is used in an actuator or the like for position adjustment which seeks a large displacement via a direct current usage. The latter one is applicable to alternating current related uses. For example, the latter one is used in an ultrasonic generating element such as an ultrasonic motor.

In addition, there are substances other than PZT-based ones that can be used as piezoelectric compositions, most of which are solid solutions using a lead based perovskite component such as lead magnesio-niobate (Pb(Mg,Nb)O$_3$: PMN) or the like as the main component.

However, these lead based piezoelectric compositions contain about 60 to 70 mass % of lead oxides and the lead oxides have an extremely high volatility even at a low temperature. If the influence on the environment is considered, it is expected that less lead oxides will be used.

Therefore, the lead-free piezoelectric composition will become an extremely important issue if the piezoelectric ceramics and the piezoelectric single-crystals are to be applied to more fields and to be used in more amounts.

As for a lead-free piezoelectric composition, for example, barium titanate (BaTiO$_3$), the bismuth layered ferroelectric and the like are well known. However, since the barium titanate has a curie point as low as 120° C. and its piezoelectric property will disappear at a temperature higher than 120° C., it will not be practical if it is bonded by welding or used in vehicles.

On the other hand, although the bismuth layered ferroelectric has a curie point of 400° C. or higher and is excellent in thermal stability, the crystal anisotropy is high. Thus, it is necessary to use a method, such as hot forging method, in which spontaneous polarization is oriented by the applied shear stress. That is, problems arise in the aspect of productivity.

Recently, the bismuth sodium titanate based composition is being studied as a new piezoelectric composition. For instance, Patent Document 1 has disclosed a piezoelectric ceramic composition containing bismuth sodium titanate.

The piezoelectric ceramic composition in Patent Document 1 contains a matrix material and the matrix material contains at least two matrix components with a perovskite structure. Or, the piezoelectric ceramic composition is only composed of the matrix component. Further, a piezoelectric ceramic composition is disclosed, in which a first matrix component is selected from the group consisting of (Bi$_{0.5}$A$_{0.5}$)EO$_3$ and BaEO$_3$ and the other matrix component is Bi(Me$_{0.5}$E$_{0.5}$)O$_3$, wherein A represents an alkali metal and is especially selected from the group consisting of sodium, potassium and a mixture of alkali metals, E is dependently selected from titanium, zirconium and their mixture, and Me is selected from the group consisting of bivalent metals.

PATENT DOCUMENT

Patent Document 1: JP-A-2013-500919

SUMMARY

However, compared to the lead based piezoelectric composition, the piezoelectric composition disclosed in Patent Document 1 is not capable of obtaining sufficient piezoelectric properties. Especially, as such a composition has a low level of spontaneous polarization, and the piezoelectric properties are desired to be further improved.

Further, in the case of Bi(Me$_{0.5}$E$_{0.5}$)O$_3$ based materials, a technical problem that a high insulation property can not achieved will arise. If such materials are used as actuators, most currents will flow into the material when the element is driven so that a problem arises that the power consumption of the electric circuit will increase. In order to solve this technical problem, the material must have a high resistance.

In this respect, the present invention has studied the composition range with which spontaneous polarization and resistance can be increased. Besides, if the low-pollution, environment and ecology are considered, the present invention aims to prepare a lead-free compound so as to provide an excellent piezoelectric composition and an excellent piezoelectric element.

In order to solve the technical problem mentioned above, the inventors use bismuth sodium titanate based composition in the test of the piezoelectric compositions with good piezoelectric properties. Then, a piezoelectric composition is found in which the composition is different from that of the conventional ones.

The piezoelectric composition is characterized in that the main component comprises the substance of the following formula with a perovskite-typed structure.

$$(Bi_{(0.5x+y+z)}Na_{0.5x})_m(Ti_{x+0.5y}Mg_{0.5y}Al_z)O_3$$

In this formula, $0.01 \leq x \leq 0.8$, $0.2 \leq y \leq 0.8$, $0.01 \leq z \leq 0.6$, $0.75 \leq m \leq 1.0$, and $x+y+z=1$.

With the ranges mentioned above, the piezoelectric properties especially the spontaneous polarization can be improved. Further, the electric resistivity also can be increased.

Besides, a piezoelectric element using the above piezoelectric composition can be provided such as a piezoelectric element used in an ink jet head or a piezoelectric actuator in which the displacement of the actuator is quite large. As a high electric resistivity can be obtained, the power consumption of the drive circuit can be inhibited when the piezoelectric element works as an actuator.

A piezoelectric sensor using the above piezoelectric composition can be provided such as a piezoelectric element with a long measuring range and a high sensitivity that is used in ultrasonic sensors, the representative of which are a sensor for measuring the distance between vehicles (this sensor is used in an auto-parking system) and a fluid level sensor. Furthermore, as a high electric resistivity can be obtained, the power consumption of the drive circuit can be inhibited when the piezoelectric element works as a sensor.

A film piezoelectric device using the above piezoelectric composition can be provided such as a piezoelectric gyro, an acceleration sensor or a piezoelectric film pump. With the excellent piezoelectric properties, a high sensitivity of the sensor can be obtained in the piezoelectric gyro or the acceleration sensor. Also, a high pump flow quantity can be achieved in the piezoelectric pump.

As described above, the piezoelectric composition according to the present invention is characterized in that it has a high spontaneous polarization and a high electric resistivity. Besides, since no lead is used, such a piezoelectric composition is extremely excellent if low pollution, environment and ecology are considered. Further, this material can provide excellent piezoelectric properties.

DETAILED DESCRIPTION OF EMBODIMENTS

Figure 1:
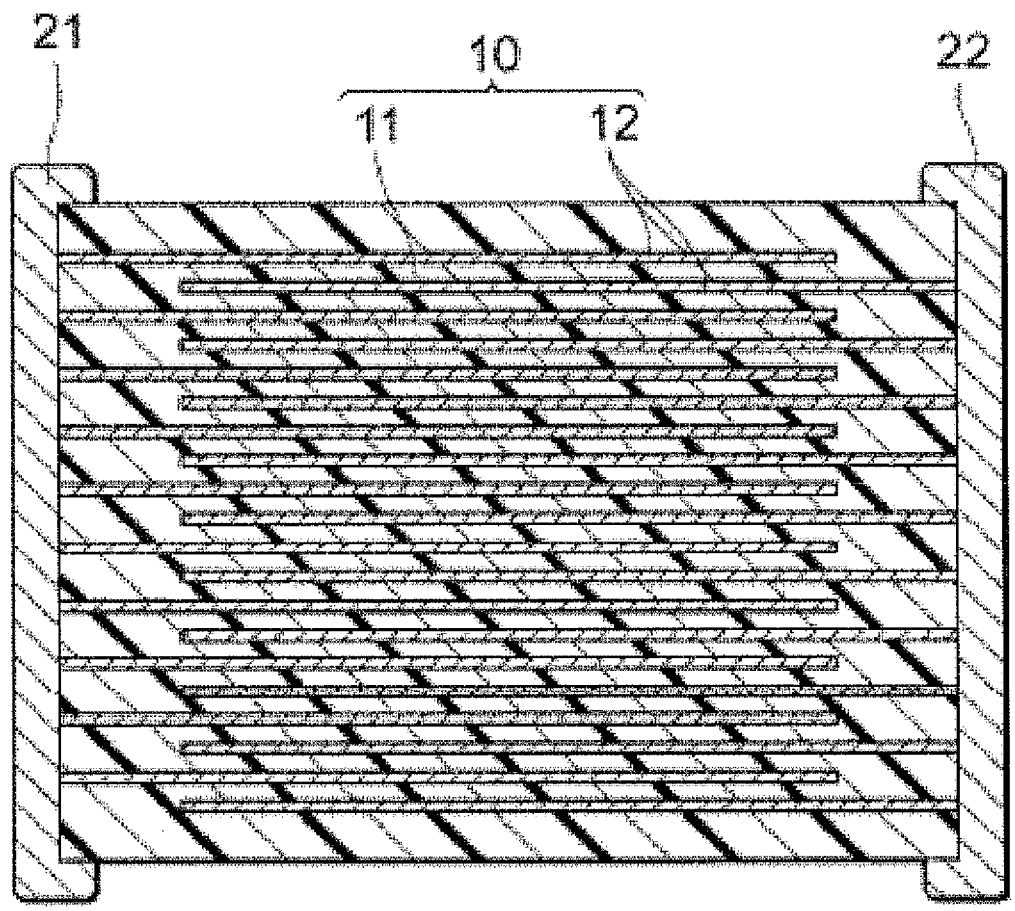
FIG. 1 is a pattern view showing the cross-section of the piezoelectric film element.

Hereinafter, the embodiments of the present invention will be described in detail.

The piezoelectric composition of the first embodiment in the present invention is characterized in that the main component contains the substance of the following formula with a perovskite-typed structure.

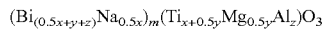

In this formula, $0.01 \leq x \leq 0.8$, $0.2 \leq y \leq 0.8$, $0.01 \leq z \leq 0.6$, $0.75 \leq m \leq 1.0$, and $x+y+z=1$.

The range of x is preferably $0.01 \leq x \leq 0.8$. When x is less than 0.01, it is hard to form the perovskite structure. On the other hand, it is impossible to obtain sufficient piezoelectric properties when x is more than 0.8.

Furthermore, the range of y is preferred to be $0.2 \leq y \leq 0.8$. When y is less than 0.2, it is impossible to get sufficient piezoelectric properties. When y is more than 0.8, the piezoelectric properties will deteriorate accompanied with generation of inhomogeneous phase, or the electric resistivity will decrease.

Besides, the range of z is preferably $0.01 \leq z \leq 0.6$. When z is less than 0.01, it is impossible to get sufficient piezoelectric properties. Then, when z is more than 0.6, inhomogeneous phases other than the perovskite structure will generate so that the piezoelectric properties will reduce.

In the formula above, the range of m is preferably $0.75 \leq m \leq 1.0$. Particularly, m represents the constituent ratio of the atoms at A site to those at B site within the perovskite structured compound in the whole piezoelectric composition, i.e., the ratio of A to B. If m is 1 or less, the material will have a high density as well as better piezoelectric properties. However, if m is less than 0.75, crystalline phases other than the perovskite-typed phase will generate, which will make the piezoelectric properties worse. Thus, m is preferred to be within the range of 0.75 or more and 1.0 or less.

The piezoelectric composition of the present embodiment contains bismuth sodium titanate as the first compound, the bismuth-magnesium-titanium composite oxides as the second compound, and bismuth aluminate as the third compound. These three components are deemed as the main component.

That is, the piezoelectric composition contains the first compound, the second compound and the third compound. These three compounds are subjected to be solid solution. And they also can be a partial solid solution.

The piezoelectric composition can be presented by the following formula if the chemical formulae of the first, the second and the third compounds are used.

The piezoelectric composition is characterized in that it can be represented by the following formula.

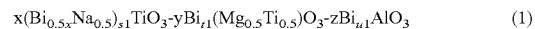

Wherein, $0.01 \leq x \leq 0.8$, $0.2 \leq y \leq 0.8$, $0.01 \leq z \leq 0.6$, and $x+y+z=1$. Further, s1, t1 and u1 are all 0.75 or more and 1.0 or less.

The bismuth sodium titanate can be listed as the first compound of the above formula 1. The composition of bismuth sodium titanate can be represented by formula 2 shown below, wherein the sodium and the bismuth are located at the A site of the perovskite structure, and the titanium is located at the B site of the perovskite structure.

In the above formula 2 of the first compound, s1 represents the constituent ratio (molar ratio) of the elements at A site to those at B site (hereinafter referred to as ratio A to B). In the case of stoichiometric composition, s1 is preferred to be 1.

However, the composition may also deviate from the stoichiometric one. If s1 is 1 or less, the sinterability will be improved, and better piezoelectric properties will be obtained. Besides, s1 is more preferably 0.75 or more and 1.0 or less because better piezoelectric properties can be obtained. The constituent amounts of sodium, bismuth and oxygen can be calculated according to the stoichiometric composition. However, they can also deviate from the stoichiometric composition.

As the second compound of the formula 1, the bismuth-magnesium-titanium composite oxides can be listed. The composition of the bismuth-magnesium-titanium composite oxides is shown by the following formula 3, wherein bismuth is located at A site of the perovskite structure, and magnesium and titanium are located at B site of the perovskite structure.

In the above formula 3, t1 represents the ratio of A to B. In the case of the stoichiometric composition, t1 is preferred to be 1. However, the composition may also deviate from the stoichiometric one. If t1 is 1 or less, the sinterability will be improved and better piezoelectric properties will be obtained. Besides, t1 is more preferably 0.75 or more and 1.0 or less because better piezoelectric properties are obtainable. The constituent amounts of magnesium, titanium and oxygen can be calculated according to the stoichiometric composition. However, they can also deviate from the stoichiometric composition.

As the third compound of the formula 1, bismuth aluminate can be listed. The composition of the bismuth aluminate is shown by the following formula 4, wherein bismuth is located at A site of the perovskite structure, and aluminum is located at B site of the perovskite structure.

$$Bi_{u1}AlO_3 \quad (4)$$

In the above formula 4, u1 represents the ratio of A to B. In the case of the stoichiometric composition, u1 is preferred to be 1. However, the composition may also deviate from the stoichiometric one. If u1 is 1 or less, the sinterability will be improved and better piezoelectric properties will be obtained. Besides, u1 is more preferably 0.75 or more and 1.0 or less because better piezoelectric properties are obtainable.

With respect to the s1, t1 and u1, as $xs1+yt1+zu1=m$, m can satisfy $0.75 \leq m \leq 1.0$.

The $(Bi_{0.5}Na_{0.5})_{s1}TiO_3$ has a rhombohedral perovskite structure, $Bi_{t1}(Mg_{0.5}Ti_{0.5})O_3$ has an orthorhombic perovskite structure, and $Bi_{u1}AlO_3$ has a tetragonal perovskite structure. Therefore, similar to the PZT based piezoelectric composition, the piezoelectric composition of the present embodiment has a structure close to the crystallographic phase boundary (morphotropic phase boundary) so that excellent piezoelectric properties can be obtained.

Further, $(Bi_{0.5}Na_{0.5})_{s1}TiO_3$ is ferroelectric. It becomes a relaxor ferroelectric when a solid solution is formed from $(Bi_{0.5}Na_{0.5})_{s1}TiO_3$ together with $Bi_{t1}(Mg_{0.5}Ti_{0.5})O_3$. However, when it becomes a relaxor material, no domain structure is observed, and only the unstable polarization that is called as the polar-nano-region might be present. If a solid solution is formed together with $Bi_{u1}AlO_3$ which is also a ferroelectric, the domain with a submicron size can be stably formed. Further, $Bi_{u1}AlO_3$ has a character that the ratio of the length of c axis to that of a axis (c/a, hereinafter referred to as the tetragonality) in the tetragonal perovskite structure is high. Hence, when this material is subjected to the solution treatment, the travel distance of the ions becomes large when an electric field is applied. As a result, a large piezoelectric displacement can be obtained.

In the present embodiment, the first, the second and the third compounds are used as the main components. Preferably, they account for 90% or more of the piezoelectric composition. Further, besides the elements constituting the first, the second and the third compounds, impurities or constituent elements for other compounds can be contained as long as their amounts are about several tens to several hundreds of ppm. Such elements can be Ba (barium), Sr (strontium), Ca (calcium), Li (lithium), Hf (hafnium), Ni (nickel), Ta (tantalum), Si (silicon), B (boron) and rare earth elements.

Further, the piezoelectric composition of the present invention preferably comprises a compound as the accessory component and this compound contains at lease one element selected from the group consisting of Mn, Fe and Cu. The total amount of the accessory component is preferably 0.04 to 0.6 mass % based on the whole main components if the calculation is performed based on elements.

The piezoelectric composition with such a composition can be prepared as follows.

First of all, powders of bismuth oxide, sodium carbonate, titanium oxide, iron oxide, alumina, magnesium carbonate and etc. are prepared as the starting materials in accordance with needs. After sufficiently dried at a temperature of 100° C. or higher, these powders are weighted based on the target composition. In addition, with respect to the starting materials, substances such as carbonates or oxalates which will turn to oxides via a firing process can be used to replace the oxides, and oxides or other substances which will turn to oxides by firing can be used in stead of the carbonates.

Next, the weighted starting materials are sufficiently mixed for 5 hours to 20 hours in an organic solvent or water by using an instrument such as a ball mill. Thereafter, the mixture is sufficiently dried, subjected to a press molding, and then calcined at a temperature of 750° C. to 900° C. for about 1 hour to 3 hours. Then, the calcined substance is milled in an organic solvent or water by a ball mill for 5 hours to 30 hours. The resultant materials are dried again and subjected to a granulation process with the addition of a binder solution. Then, a press molding process is provided to the powders obtained from the granulation process so that the powders are produced into blocks.

After produced into blocks, the molded body is subjected to a thermal treatment at a temperature of 400° C. to 800° C. for 2 hours to 4 hours so that the binder will volatilize. Then, the sintering process is performed at a temperature of 950° C. to 1300° C. for about 2 hours to 4 hours. The heating rate and cooling rate in the sintering process are both, for example, about 50° C./hour to 300° C./hour. After the sintering process, the obtained sintered body is polished according to needs and electrodes are disposed. Thereafter, the resultant is polarized for about 5 minutes to 1 hour in a silicone oil of 25° C. to 150° C. with an applied electric field of 5 MV/m to 10 MV/m. Thus, the piezoelectric composition mentioned above is obtained.

The average particle diameter of the grains in the piezoelectric composition obtained via the method described above is about 0.5 μm to 20 μm.

FIG. 1 shows a structure example of the piezoelectric element using the piezoelectric composition according to the present embodiment. This piezoelectric element has a laminated body 10 in which multiple piezoelectric layers 11 composed of the piezoelectric composition of the present embodiment and multiple internal electrodes 12 are alternatively laminated. Each piezoelectric layer 11 has a preferable thickness of, for example, about 1 μm to 100 μm. The number of the laminated piezoelectric layers 11 may be determined in accordance with the target displacement value.

For example, such a piezoelectric element can be prepared as follows. Firstly, after calcined powders are prepared by using a same method as that for the piezoelectric composition described above, vehicles are added. They are mixed to prepare the paste for the piezoelectric layer.

Then, in order to form the internal electrodes 12, the conductive material and the vehicles are mixed. Otherwise, various oxides or organometallic compounds which will turn to conductive materials after a firing process are mixed with the vehicles. In this way, the paste for the internal electrodes is done. The conductive material is not particularly limited. For example, the conductive material is preferably at least one selected from the group consisting of silver (Ag), gold (Au), platinum (Pt), copper (Cu), nickel (Ni) and palladium (Pd), or the alloy thereof. In addition, besides these components, the internal electrode 12 may further contain various trace components such as phosphorus (P) with an amount of about 0.1 wt % or less. The thickness of the internal electrode 12 is preferred to be, for example, about 0.5 µm to 3 µm.

In addition, additives such as dispersing agent, plasticizer, dielectric material or insulating material can be added into the paste for the internal electrode if necessary.

The paste for the piezoelectric layer and the paste for the internal electrode obtained by the above steps are used to prepare a green chip as the precursor of the laminated body 10 through, for example, a print method or a sheet method.

After a debindering process is applied to the green chip which is prepared by the steps mentioned above, the green chip is sintered to form the laminated body 10.

The end surfaces in the laminated body 10 that is obtained by the above steps are polished by barrel-polishing or sandblasting. The paste for the terminal electrodes which is prepared by a same process with that of the paste for the internal electrodes is printed or imprinted, and then sintered. Thus, the terminal electrodes 21 and 22 are formed. The paste for the terminal electrodes contains, for example, the conductive material, glass frit and vehicle. The conductive material contains at least one selected from the group consisting of Ag, Au, Cu, Ni, Pd and Pt. The vehicle is an organic vehicle or an aqueous vehicle, wherein the organic vehicle is one obtained by dissolving the binder in the organic solvent, and the aqueous vehicle is one obtained by dissolving the water-soluble binder and dispersing agent in water. In this way, the piezoelectric element shown in FIG. 1 is obtained.

The preparation method described above is called as solid-phase reaction. A vapor phase growth method can be listed as other representative method.

The vapor phase growth method is a process in which the starting material (i.e., target material) is vaporized in a vacuum chamber to form a film with a thickness of about several tens of nanometers to several microns on a smooth substrate.

The vapor phase growth method is preferred to be sputtering, evaporation, pulsed laser deposition and the like. With these methods, a dense film can be formed in an atomic level and segregation will hardly occur. In the vapor phase growth method, the starting material (target material) is physically vaporized and then deposited on the substrate. The excitation source varies according to the film-forming method.

When the sputtering method is used, Ar plasma becomes the excitation source. When it is the evaporation method, electron beam is the excitation source. If the pulsed laser deposition is used, the laser will be the excitation source and will irradiate the target.

As described above, there are several methods for thin film deposition of the piezoelectric film in the vapor phase growth. As a representative example, the pulsed laser deposition method will be described.

In a vacuum chamber, the substrate for thin film deposition is heated at a temperature of 500° C. to 800° C. The substrate is heated while the vacuum degree is kept at $1 \times 10^{-3}$ to $1 \times 10^{-5}$ Pa so that the cleanliness of the surface will be improved.

During the deposition step, the laser irradiates the target material. The evaporation of the target material due to the radiation of the laser will make the film deposited on the substrate.

Besides the temperature, the parameters for the substrate are power of the laser, the concentration of the laser, the distance between the substrate and the target and the like. The desired properties will be obtained by controlling these parameters.

In addition, in order to supplement oxygen during the film deposition of oxides, the oxygen gas is circulated preferably under an oxygen pressure of $1 \times 10^{-1}$ to $1 \times 10^{-5}$ Pa. If a higher oxygen pressure is used, the rate of the film deposition will decrease.

The target material which is the starting material for the film deposition can be a sintered body prepared by the solid-phase reaction. When such a vapor phase growth method is used, the piezoelectric composition of the present invention is usually formed on the Si substrate or the MgO substrate or the $SrTiO_3$ substrate. If the piezoelectric composition is deposited on the Si substrate, the Pt lower electrode is deposited as a film after the film of Ti or Cr adhesion layer is formed.

As the method for yielding a polycrystalline film, there is a method in which the substrate is heated while the crystal is growing. In another method, the polycrystalline film is obtained by forming a film at room temperature and then annealing the film at a desired temperature. When deposition of the film is carried out at room temperature, the desired crystal phases can be obtained by depositing the piezoelectric material and then appropriately applying a post-annealing treatment.

The piezoelectric composition of the present invention can be utilized in, for example, piezoelectric sounders, ultrasonic sensors, piezoelectric actuators, piezoelectric transformers, film sensors, film actuators or piezoelectric ultrasonic motors. In addition, the piezoelectric composition can be applied to other elements as long as the piezoelectric composition can be used in these elements.

EXAMPLES

Hereinafter, the present invention will be further described in detail based on the examples and the comparative examples. However, the present invention is not limited to the following examples.

Example 1 to Example 13

Figure 2:
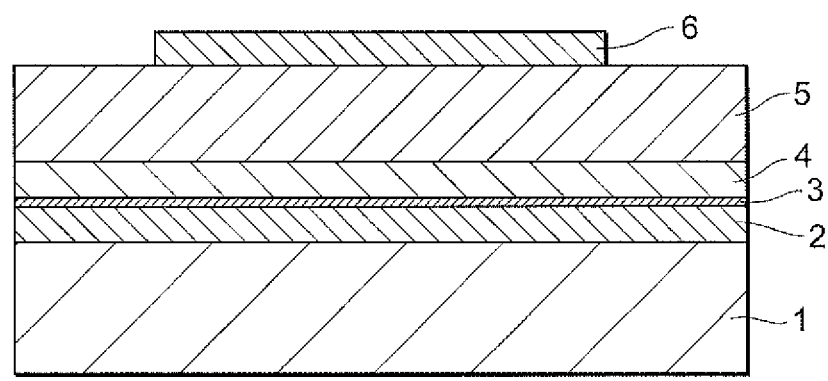
FIG. 2 is a pattern view showing the laminated body.

FIG. 2 was a cross-section view showing the structure of the piezoelectric film element in the examples. With respect to the substrate, the Si substrate 1, to which a thermal oxide film was attached, was used. The Si substrate 1 was a round substrate with its diameter of 3 inches, and it was composed of the Si substrate 1 with a thickness of 0.5 mm and a (100) plane orientation, and a thermal oxide film 2 with a thickness of 500 nm attached thereon. First of all, a Ti adhesion layer 3 and a lower electrode layer 4 were formed on the substrate by a RF magnetron sputtering method. The Ti adhesion layer 3 had a thickness of 20 nm and the Pt lower electrode layer 4 formed thereon had a thickness of 200 nm. These layers were preferably orientated to the (111) plane. The thickness of the Ti adhesion layer 3 could be properly adjusted as long as the layer could work as an adhesion layer.

The deposition condition of the Ti adhesion layer 3 and the Pt lower electrode layer 4 was that the temperature of the substrate was room temperature, the discharge power was 100 W, the introduced gas was Ar, and the deposition pressure was 0.3 Pa.

Thereafter, a piezoelectric film 5 was formed on the Pt lower electrode layer 4. The pulsed laser deposition method (hereinafter referred to as PLD) was used as the deposition method. The laser source was the excimer laser and the wave length in use was 248 nm. The piezoelectric film S had a thickness of 500 nm. As the targets for PLD, a target of $(Bi_{0.5}Na_{0.5})TiO_3$, a target of $Bi(Mg_{0.5}Ti_{0.5})O_3$, and a target with an element ratio of Bi to Al being 1:1 were used. The rate of film deposition was respectively 0.02 nm/shot, 0.18 nm/shot and 0.006 nm/shot. The composition ratios shown in Table 1 were obtained by adjusting the number of shots. The condition for film deposition was as follows. Specifically, the substrate was at room temperature, the power of the laser was 60 mJ, $O_2$ was introduced and the pressure was $1.33 \times 10^{-3}$ Pa. After the film was deposited, a anneal process was done for 1 minute at 800° C. under oxygen atmosphere. With these processes, piezoelectric films of the examples were obtained.

In order to evaluate the electrical properties of piezoelectric film 5, Pt with a thickness of 100 nm was fanned on the upper surface of the piezoelectric film 5 by the RF magnetron sputtering method. The film deposition condition was the same as that for the lower electrode. Then, an upper electrode 6 was formed by photolithography and etching. A piezoelectric film element shown in FIG. 2 for the evaluation of electrical properties was prepared.

The spontaneous polarization [$uC/cm^2$] was tested as the evaluation of piezoelectric properties. The spontaneous polarization was calculated from the product of the piezoelectric constant [C/N] and the stress [$N/m^2$]. Thus, the spontaneous polarization was necessary to reach a maximum level so as to get a high piezoelectric constant.

The spontaneous polarization was measured by using the Sawyer-Tower circuit. The spontaneous polarization was tested while an alternating current field of −50 kV/mm to +50 kV/mm was applied. In addition, the maximal value Pm of polarization was also measured. The input frequency of the circuit was 1 kHz.

The resistance value of the piezoelectric film element was also evaluated. In the measurement of the resistance, the value of resistance was calculated based on the ratio of the current value to the voltage value, both of which were obtained from the Sawyer-Tower method. Further, the resistivity ρ [Ohm×cm] was calculated based on the area of the electrode and the thickness of the element.

Comparative Examples 1 to 8

In Comparative Examples 1 to 8, the piezoelectric film elements were prepared by using the same method as that in Examples except that the constituent ratios of the target of $(Bi_{0.5}Na_{0.5})TiO_3$, the target of $Bi(Mg_{0.5}Ti_{0.5})O_3$ and the target with the element ratio of Bi to Al being 1:1 were changed.

The results of the maximal value Pm of spontaneous polarization and the resistivity ρ were shown in Table 1. The increasing rate of Pm was the increasing rate based on the spontaneous polarization of Comparative Example 1. That is, the increasing rate was the value obtained by diving each Pm value by 11 [$uC/cm^2$].

TABLE 1

| | Samples No. | Constituent ratio x of $(Bi_{0.5}Na_{0.5})TiO_3$ | Constituent ratio y of $Bi(Mg_{0.5}Ti_{0.5})O_3$ | Constituent ratio z of $BiAlO_3$ | Pm [$uC/cm^2$] | Increasing rate of Pm | ρ [Ohm * cm] |
|---|---|---|---|---|---|---|---|
| 1 | Example-1 | 0.36 | 0.63 | 0.01 | 32 | 2.91 | 1.41E+10 |
| 2 | Example-2 | 0.37 | 0.23 | 0.40 | 24 | 2.18 | 2.35E+10 |
| 3 | Example-3 | 0.21 | 0.30 | 0.49 | 29 | 2.64 | 2.13E+10 |
| 4 | Example-4 | 0.80 | 0.19 | 0.01 | 22 | 2.00 | 1.60E+10 |
| 5 | Example-5 | 0.21 | 0.20 | 0.59 | 28 | 2.55 | 2.17E+10 |
| 6 | Example-6 | 0.08 | 0.32 | 0.60 | 26 | 2.36 | 1.77E+10 |
| 7 | Example-7 | 0.21 | 0.44 | 0.35 | 33 | 3.00 | 2.27E+10 |
| 8 | Example-8 | 0.16 | 0.56 | 0.28 | 40 | 3.64 | 1.93E+10 |
| 9 | Example-9 | 0.11 | 0.49 | 0.40 | 38 | 3.45 | 2.23E+10 |
| 10 | Example-10 | 0.42 | 0.42 | 0.16 | 35 | 3.18 | 1.64E+10 |
| 11 | Example-11 | 0.21 | 0.62 | 0.17 | 37 | 3.36 | 1.25E+10 |
| 12 | Example-12 | 0.01 | 0.71 | 0.28 | 47 | 4.27 | 1.28E+10 |
| 13 | Example-13 | 0.05 | 0.80 | 0.15 | 47 | 4.27 | 1.34E+10 |
| 14 | Comparative Example-1 | 0.90 | 0.05 | 0.05 | 11 | 1.00 | 1.00E+10 |
| 15 | Comparative Example-2 | 0.80 | 0.15 | 0.05 | 12 | 1.09 | 1.00E+10 |
| 16 | Comparative Example-3 | 0.21 | 0.17 | 0.62 | 16 | 1.45 | 2.34E+10 |
| 17 | Comparative Example-4 | 0.05 | 0.30 | 0.65 | Unmeasurable due to leakage | — | <1.00E+6 |
| 18 | Comparative Example-5 | 0.05 | 0.05 | 0.90 | Unmeasurable due to leakage | — | <1.00E+6 |
| 19 | Comparative Example-6 | 0.50 | 0.50 | 0.00 | 13 | 1.18 | 1.84E+08 |
| 20 | Comparative Example-7 | 0.08 | 0.84 | 0.08 | Unmeasurable due to leakage | — | <1.00E+6 |
| 21 | Comparative Example-8 | 0.00 | 0.50 | 0.50 | 12 | — | 1.34E+10 |

As shown in Table 1, when the constituent ratio x of $(Bi_{0.5}Na_{0.5})TiO_3$ was 0.01 or more and 0.8 or less, the constituent ratio y of $Bi(Mg_{0.5}Ti_{0.5})O_3$ was 0.2 or more and 0.8 or less, the constituent ratio z of $BiAlO_3$ was 0.01 or more and 0.6 or less and $x+y+z=1$, the maximal value Pm of spontaneous polarization was 2.0 times or more of that in Comparative Example 1. In other words, the piezoelectric properties could be improved if bismuth sodium titanate as the first compound, the bismuth-magnesium-titanium composite oxides as the second compound and bismuth aluminate as the third compound were contained or the solid solution thereof was contained.

The resistivity ρ was also compared among Examples and Comparative Examples. In Comparative Example 6 in which $BiAlO_3$ was not contained, the resistivity was $1\times10^8$ [Ωm]. With the addition of $BiAlO_3$, the resistivity was double-digit increased.

Further, as shown in Examples 7 to 11, when the constituent ratio x of $(Bi_{0.5}Na_{0.5})TiO_3$ was 0.01 or more and 0.5 or less, the constituent ratio y of $Bi(Mg_{0.5}Ti_{0.5})O_3$ was 0.4 or more and 0.8 or less, the constituent ratio z of $BiAlO_3$ was 0.1 or more and 0.6 or less and $x+y+z=1$, the maximal value Pm of spontaneous polarization was 3.0 times or more of that in Comparative Example 1.

The resistivity ρ was also compared among Examples and Comparative Examples. In Comparative Example 6 in which $BiAlO_3$ was not contained, the resistivity was $1\times10^8$ [Ωcm]. With the addition of $BiAlO_3$, the resistivity was double-digit increased.

Further, as shown in Examples 12 to 13, when the constituent ratio x of $(Bi_{0.5}Na_{0.5})TiO_3$ was 0.01 or more and 0.2 or less, the constituent ratio y of $Bi(Mg_{0.5}Ti_{0.5})O_3$ was 0.7 or more and 0.8 or less, the constituent ratio z of $BiAlO_3$ was 0.1 or more and 0.3 or less and $x+y+z=1$, the maximal value Pm of spontaneous polarization was 4.0 times or more of that in Comparative Example 1.

The resistivity ρ was also compared among Examples and Comparative Examples. In Comparative Example 6 in which $BiAlO_3$ was not contained, the resistivity was $1\times10^8$ [Ωcm]. With the addition of $BiAlO_3$, the resistivity was double-digit increased.

Examples 13 to 16 and Comparative Examples 9 to 10

Further, the compositions shown in Table 2 were discussed so as to study the range of m.

In Examples 13 to 16 and Comparative Examples 9 to 10, the target of $(Bi_{0.5}Na_{0.5})_mTiO_3$ and the target of $Bi(Mg_{0.5}Ti_{0.5})_mO_3$ were prepared, wherein the ratio of A to B (the value of m) were changed. Then, the target with the element ratio of Bi to Al being m:1 was prepared. Thus, the piezoelectric film elements were prepared by using the same method as that of the Examples.

TABLE 2

| Samples No. | Constituent ratio x of $(Bi_{0.5}Na_{0.5})TiO_3$ | Constituent ratio y of $Bi(Mg_{0.5}Ti_{0.5})O_3$ | Constituent ratio z of $BiAlO_3$ | m | Pm [μC/cm²] | ρ [Ohm * cm] |
|---|---|---|---|---|---|---|
| 22 Example-13 | 0.05 | 0.71 | 0.24 | 1.00 | 47 | 1.28E+10 |
| 23 Example-14 | 0.05 | 0.71 | 0.24 | 0.90 | 42 | 1.28E+10 |
| 24 Example-15 | 0.05 | 0.71 | 0.24 | 0.80 | 44 | 1.28E+10 |
| 25 Example-16 | 0.05 | 0.71 | 0.24 | 0.75 | 45 | 1.28E+10 |
| 26 Comparative Example-9 | 0.05 | 0.71 | 0.24 | 1.01 | 11 | 1.28E+10 |
| 27 Comparative Example-10 | 0.05 | 0.71 | 0.24 | 0.73 | 13 | 1.28E+09 |

As shown in Table 2, when m was smaller than 0.75, both the resistivity ρ and the maximal value Pm of spontaneous polarization became smaller. On the other hand, when m was larger than 1.00, the maximal value Pm of spontaneous polarization also became smaller.

As a thin film deposition method of the piezoelectric film, the PLD method had been described. However, any one of the sputtering method, the solution method and the CVD (chemical vapor deposition) method could also be used.

Further, it had been confirmed that the same effect could be achieved even if the piezoelectric element or the piezoelectric film, in which the piezoelectric composition was used, was prepared by the solid-phase reaction.

The present invention has been described by providing the embodiments and examples above, but the present invention is not limited thereto. In the embodiments and examples described above, only the case in which only the first and the second compounds are contained has been described. However, other compounds also can be contained therein.

The piezoelectric composition of the present invention can be widely utilized in the fields of the actuator, the sensor or the resonator.

DESCRIPTION OF REFERENCE NUMERALS

1 Si substrate
2 Thermal oxide film
3 Ti adhesion layer
4 Lower electrode
5 Piezoelectric film
6 Upper electrode
10 Laminated body
11 Piezoelectric layer
12 Internal electrode layer
21 Terminal electrode
22 Terminal electrode

What is claimed is:
1. A piezoelectric composition comprising a substance represented by the following formula with a perovskite-typed structure as the main component,

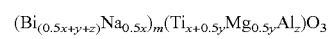

$(Bi_{(0.5x+y+z)}Na_{0.5x})_m(Ti_{x+0.5y}Mg_{0.5y}Al_z)O_3$ wherein
$0.01 \leq x \leq 0.5$,
$0.4 \leq y \leq 0.8$,
$0.1 \leq z \leq 0.6$
$m=1$, and
$x+y+z=1$.

2. A piezoelectric element comprising an electrode for applying voltage to said piezoelectric composition according to claim 1.

* * * * *